(12) United States Patent
Fry et al.

(10) Patent No.: US 8,332,876 B2
(45) Date of Patent: Dec. 11, 2012

(54) METHOD, SYSTEM AND APPARATUS FOR TRI-STATING UNUSED DATA BYTES DURING DDR DRAM WRITES

(75) Inventors: James Fry, Aurora (CA); George Guthrie, Mississauga (CA)

(73) Assignee: ATI Technologies ULC, Markham, Ontario (CA)

( * ) Notice: Subject to any disclaimer, the term of this patent is extended or adjusted under 35 U.S.C. 154(b) by 1024 days.

(21) Appl. No.: 12/274,800

(22) Filed: Nov. 20, 2008

(65) Prior Publication Data

US 2010/0125858 A1 May 20, 2010

(51) Int. Cl.
  *G06F 13/00* (2006.01)
(52) U.S. Cl. ............ 719/321; 719/327; 365/221
(58) Field of Classification Search ............ 719/321, 719/327; 365/221
  See application file for complete search history.

(56) References Cited

U.S. PATENT DOCUMENTS

| | | | |
|---|---|---|---|
| 5,327,121 A | 7/1994 | Antles, II | |
| 5,406,525 A | 4/1995 | Nicholes | |
| 5,585,740 A | 12/1996 | Tipon | |
| 5,640,337 A | 6/1997 | Huang et al. | |
| 6,256,248 B1 * | 7/2001 | Leung | 365/222 |
| 6,532,180 B2 * | 3/2003 | Ryan et al. | 365/195 |
| 6,643,194 B2 * | 11/2003 | Ryan et al. | 365/195 |
| 6,668,345 B1 * | 12/2003 | Ooishi et al. | 714/710 |
| 6,898,648 B2 * | 5/2005 | LaBerge | 710/100 |
| 7,139,852 B2 | 11/2006 | LaBerge | |

OTHER PUBLICATIONS

International Search Report and Written Opinion from Canadian Patent Office; International Application No. PCT/CA2009/001655; dated Feb. 8, 2010.
EP Search Report; EP Application No. 09827078.8; dated Jun. 5, 2012.

* cited by examiner

*Primary Examiner* — Andy Ho
(74) *Attorney, Agent, or Firm* — Faegre Baker Daniels LLP (57) ABSTRACT

A memory interface circuit includes a plurality of data bus drivers and logic adapted to be operatively responsive to write driver mask information. If desired, the plurality of bus drivers and the logic may be implemented in separate integrated circuits. The plurality of bus drivers are adapted to be responsive to a write operation. The logic is also adapted to disable any one of the plurality of data bus drivers based on the write driver mask information during the write operation.

18 Claims, 6 Drawing Sheets

METHOD, SYSTEM AND APPARATUS FOR TRI-STATING UNUSED DATA BYTES DURING DDR DRAM WRITES

FIELD OF THE INVENTION

The present invention relates generally to memory processing, and more particularly, to a method, system and apparatus that employ double data rate (DDR) memories.

BACKGROUND OF THE INVENTION

Double data rate (DDR) dynamic random access memory (DRAM) represent a class of memory integrated circuits used in devices to achieve twice as much bandwidth than preceding single data rate DRAMs. This is accomplished by double pumping (i.e., transferring data on both the rising and falling edges of the clock signal) without increasing an associated clock frequency. Dual in-line memory modules (DIMMs) represent memory modules that comprise a series of dynamic random access memory integrated circuits. DIMMs based on DDR-DRAM have data at double the rate of the clock. This can be achieved by clocking on both the rising and falling edges of the data strobes. Currently, a write transaction to a double data rate (DDR) dual in-line memory module (i.e., DDR DIMM)) expects all data drivers to transmit during a write operation. During such write operations, all transmitters (i.e., data drivers) are active even though not all data drivers are used during such operations. As such, write transactions to DDR DIMMs expect all data drivers to transmit, and thus, unnecessarily consume power. This leads to power being wasted, which is a critical problem in today's integrated circuits and devices.

Moreover, current low-power DDR designs may not have termination associated with the DDR receivers. Such DDR designs still send data bits even though such data bits are masked and not stored by memory. However, some graphics DDR (GDDR) are configured with termination having a pull-up to power at the receiver side. These GDDR devices usually have all data drivers on during a write operation. In GDDR devices, if the receive termination is configured with only a pull up (or only a pull down), then having the driver on while driving 1 (or 0 in the case of pull down) results in no power being consumed because the driver and the termination are being pulled in the same direction. In such GDDR devices, it is also possible to tristate (i.e., turn off) the data driver rather than drive 1 in the event of power pull-up termination, or drive 0 in the event of ground pull-down termination for GDDR. Thus, for GDDR devices having termination to power, driving 1 can result in zero I/O power consumption. However, with respect to DDR devices, such an approach of driving 1s when the DDR receivers are terminated to power does not result in zero power consumption for such DDR devices.

Because many devices that utilize DDR memories are battery powered, it is desirable, among other things, to more efficiently reduce power consumption in order to, for example, increase the battery life of such devices.

BRIEF DESCRIPTION OF THE DRAWINGS

The disclosure will be more readily understood in view of the following description when accompanied by the below figures, wherein like reference numerals represent like elements.

DETAILED DESCRIPTION OF THE PREFERRED EMBODIMENTS

In one example, a memory interface circuit includes a plurality of data bus drivers and logic adapted to be operatively responsive to write driver mask information. If desired, the plurality of bus write drivers and the logic may be implemented in separate integrated circuits. The plurality of bus drivers are adapted to be responsive to a write operation. The logic is also adapted to selectively disable any one of the plurality of data bus drivers based on the write driver mask information during the write operation. A related method is also disclosed.

Among other advantages, the memory interface circuit, method and system consumes less power than known memory interface circuits, methods and systems employing double data rate (DDR) memories. In one example, the memory interface circuit reduces the amount of power consumption that occurs during DDR write operations by determining which data bus drivers actually need to transmit and which data bus drivers do not.

In one example, at least one strobe driver may be provided to generate strobe signals at predetermined clock intervals of the write operation. At least one data mask driver may be provided to receive the write driver mask information and generate outputs that determine which data bytes to mask. Each data mask driver may be coupled to a logic module. The logic module can then select at least one of the plurality of data bus drivers.

In one example, the logic module includes an OR-gate structure. The OR-gate structure includes a plurality of OR gates each one having an input responsive to write driver mask information. The output of each OR-gate may be coupled to a respective bus driver.

In one example, a plurality of DDR receivers may be operatively coupled to the data bus drivers such that each of the plurality of DDR receivers has inputs configured with at least one pull-up resistor and at least one pull-down resistor to cause a mid-point termination structure. The mid-point termination structure causes a corresponding one of each of the DDR receivers to be pulled high in the absence of a write operation, and/or the mid-point termination structure causes a corresponding one of each of the DDR receivers to be pulled low during a write operation.

A device includes the memory interface circuit, and may be a wireless handheld device or any suitable device.

As used herein, the term "circuit" or "module" can include an electronic circuit, one or more processors (e.g., shared, dedicated, or group of processors such as but not limited to microprocessors, DSPs, or central processing units) and memory, that execute one or more software or firmware programs, combinational logic circuits, an ASIC, and/or other suitable components that provide the described functionality. A "circuit" or "module" can be "powered down" by reducing power to a desired reduced power level including to a level rendering it inoperative. Likewise, a "circuit" or "module" can be "powered up" by increasing its supply power to a level rendering it operative. Additionally, as will be appreciated by those of ordinary skill in the art, the operation, design, and organization, of a "circuit" or "module" can be described in a hardware description language such as Verilog™, VHDL, or other suitable hardware description languages.

Figure 1:
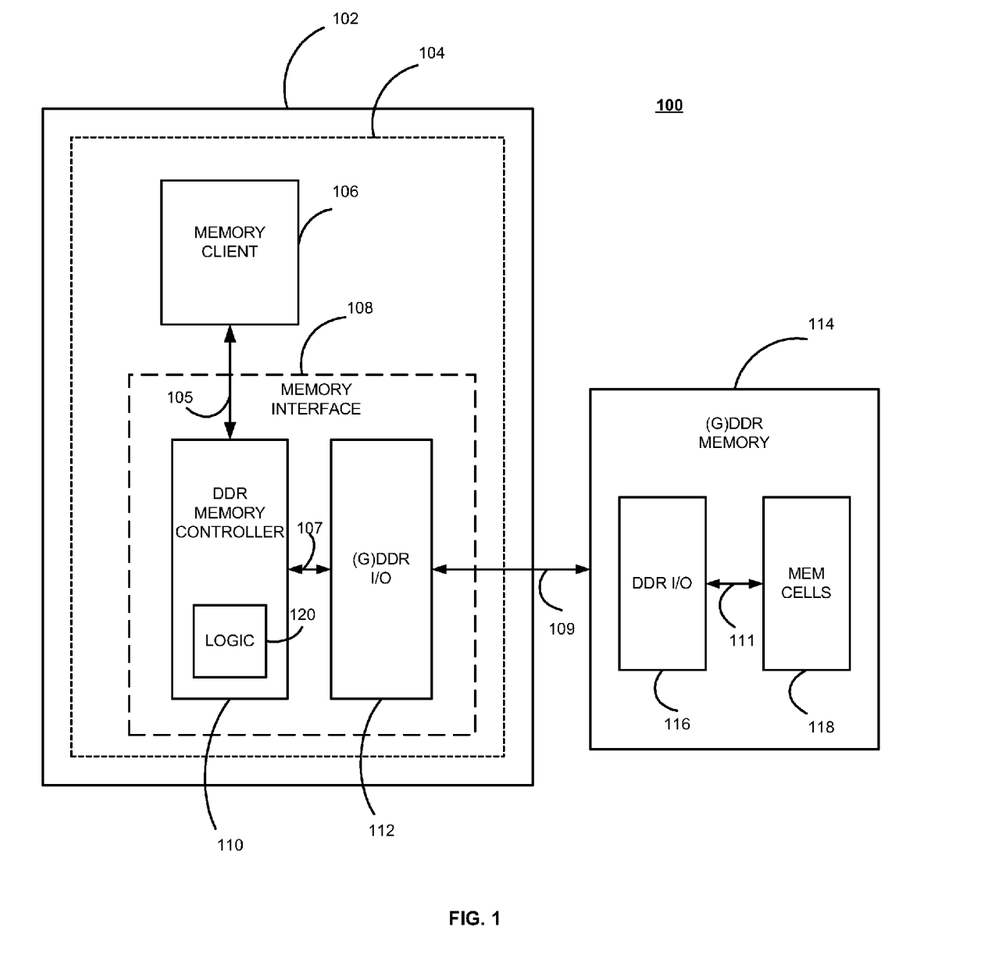
FIG. 1 illustrates an exemplary block diagram of a memory interfacing circuit system configured to save power during double data rate (DDR) memory transactions.

FIG. 1 illustrates an exemplary block diagram of a memory interfacing circuit system 100 that is configured to save power during double data rate (DDR) memory transactions. Such a system 100 may optionally be operated in an apparatus 102 such as a laptop computer, server, hand-held device (such as personal digital assistant, mobile telephone, video player), or any suitable apparatus. The system 100 can also be configured as an integrated circuit 104 embedded within the apparatus 102. The accompanying disclosure herein of such a system 100, thus, describes techniques of saving power during DDR memory transactions by, for example, tri-stating unused data bus drivers during DDR memory write transactions. This can be accomplished by a memory interface circuit 108 that includes multiple data bus drivers that are adapted to be responsive to a write operation. The memory interface circuit 108 may include a DDR memory controller 110 and DDR I/O transceiver block 112. The DDR memory controller 110 and DDR I/O transceiver block 112 may be operatively coupled to each other via a bus 107. It will be recognized that a graphics DDR (GDDR) I/O transceiver can be used interchangeably with the DDR I/O transceiver block 112. In one embodiment, the DDR memory controller 110 can be configured with a logic module 120 that can be adapted to be operatively responsive to write driver mask information. Such logic module 120 may be configured to enable the system 100 to achieve power reduction during DDR write operations. As an example, the logic module 120 may operate to disable any of the multiple data bus drivers based on the write driver mask information during the write operation. The logic module 120 can also be configured to determine which of the multiple data bus drivers to enable based on the write driver mask information during a write operation. The write driver mask information serves to determine which data bus drivers need to transmit (i.e., written to memory), and which data bus drivers do not. In operation, the write driver mask information associated with a data bus driver can drive high when such data bus driver is being masked i.e., not writing to memory. Also, the write driver mask information associated with a data bus driver can drive low when such data bus driver is configured to write to memory. Such write driver mask information can then be used to turn off (i.e., tri-state) selected I/O drivers associated with the DDR I/O transceiver block 112 during a write operation. This results in power savings during double data rate (DDR) memory transactions, such as a write transaction.

A memory client 106 can be connected to the memory interface 108, via a bus 105, in order to facilitate operative communication among other components related to the system 100. The memory client 106 may be configured as a central processor unit (CPU) core, graphics processor unit (GPU) core, microcontroller, a portion thereof or any suitable structure that needs access to memory. A detailed discussion of the interfacing of the memory client 106 (e.g., processor) to other components related to the system is provided later below.

The memory interface circuit 108 may be operatively coupled to the DDR memory 114 via a bus 109. The DDR memory 114 may include memory integrated circuits that can be used in devices such as computers, mobile phones, digital audio players, handheld devices, etc. Components within the DDR memory 114 comply with JEDEC standards for features related to memory chips and memory modules. DDR memory 114 may include a DDR I/O transceiver block 116 that receives data/information transmitted from the DDR I/O transceiver block 112 via the bus 109. DDR I/O transceiver block 116 can also include resistor termination structures at its input. Such structures may be configured as midpoint termination structures. Midpoint termination structures at the DDR I/O receive inputs help improve the signal integrity of the write operations during the DDR memory transactions. This enables the DDR memory transactions in system 100 to exhibit improvements over previously known single data rate transactions by, for example, achieving nearly twice as much bandwidth by double pumping without increasing the clock frequency. Such double pumping can require transfers of data on both the rising and falling edges of a given clock signal. The DDR I/O transceiver block 116 may interface with memory cell 118 via bus 111 in order to facilitate the operations of the DDR memory 114. The configuration of such memory cells is well known in the art. As an example, the memory cells 118 are arranged in rows (i.e., word lines) and columns (i.e., bit lines). Such memory cells operate as a collection of capacitors that may be charged to produce a 1 or 0. Such memory cells may also store data in 8-bit (1-byte) chunks of memory.

Figure 2:
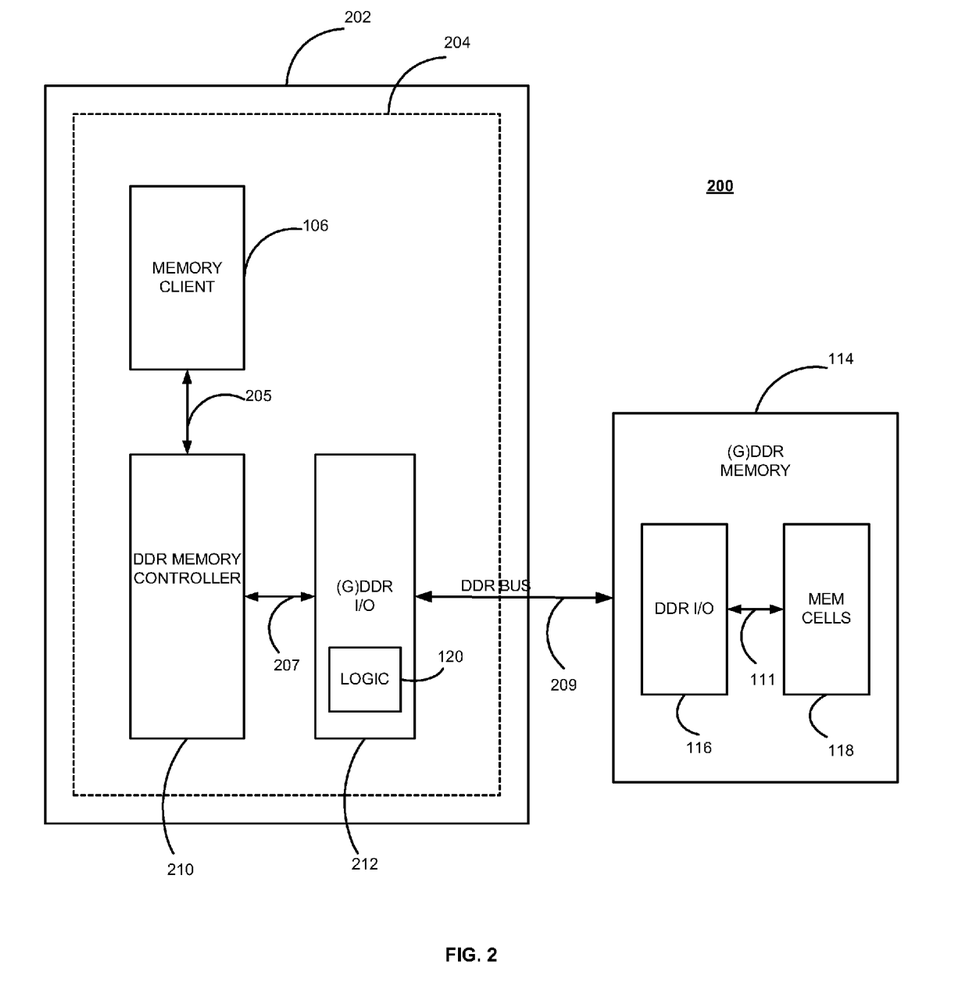
FIG. 2 illustrates an exemplary block diagram of another embodiment of a memory interfacing circuit system configured to save power during DDR memory transactions.

FIG. 2 illustrates an exemplary block diagram of another embodiment of a memory interfacing circuit system 200 that is configured to save power during double data rate (DDR) memory transactions by, for example, tri-stating unused data bytes during DDR memory write transactions. Such a system 200 may optionally be operated in an apparatus 202 such as a laptop computer, server, hand-held device (such as personal digital assistant, mobile telephone, video player), or any suitable apparatus. The system 200 can also be configured as an integrated circuit 204 within the apparatus 202. In this embodiment, a memory client 106 can be connected to the DDR memory controller 210 to facilitate operative communication among other components related to the system 200. The memory client 106 may be configured as a central processor unit (CPU) core, graphics processor unit (GPU) core, microcontroller, a portion thereof or any suitable structure that needs access to memory. The DDR memory controller 210 includes multiple data bus drivers that are adapted to generate write driver mask information that control write operations. Such write driver mask information serves to determine which data bus drivers need to transmit (i.e., write to memory), and which data bus drivers do not. The DDR memory controller 210 also determines which the byte values to write. Thus, when the DDR memory controller 210 determines not to write via selected data bus drivers, the DDR memory controller 210 can then generate write driver mask information which operates to mask those data bus drivers. Thus, in operation, the write driver mask information associated with a data bus driver can drive high when such data bus driver is being masked i.e., not writing to memory. Also, the write driver mask information associated with a data bus driver can drive low when such data bus driver is configured to write to memory.

Further, in an embodiment, the logic module 120 which facilitates the power reduction features of system 200 is configured to be located within DDR I/O transceiver block 212. In this embodiment, the logic 120 is part of the DDR I/O transceiver block 212 instead of the DDR memory controller 210 (as in FIG. 1). The DDR I/O transceiver block 212 receives its input control signals from the DDR memory controller 210 via bus 207. The logic module 120 may be adapted to be operatively responsive to the write driver mask information generated by the DDR memory controller 210. Such logic module 120 may also be configured to enable the system 200 achieve power reduction during DDR write operations. As an example, the logic may operate to disable any one of the multiple data bus drivers based on the write driver mask information during the write operation. Such write driver mask information can then be used to turn off (i.e., tri-state) selected I/O drivers associated with the DDR I/O transceiver block 212. This results in power savings during double data rate (DDR) memory transactions, such as write transactions. Of course, the logic module 120 can be configured to enable any of the data bus drivers during a write operation based on the write driver mask information. Further, DDR I/O transceiver block 212 may be operatively coupled to DDR memory 114 via DDR bus 209. The features of DDR memory 114 have been previously described in FIG. 1.

Figure 3:
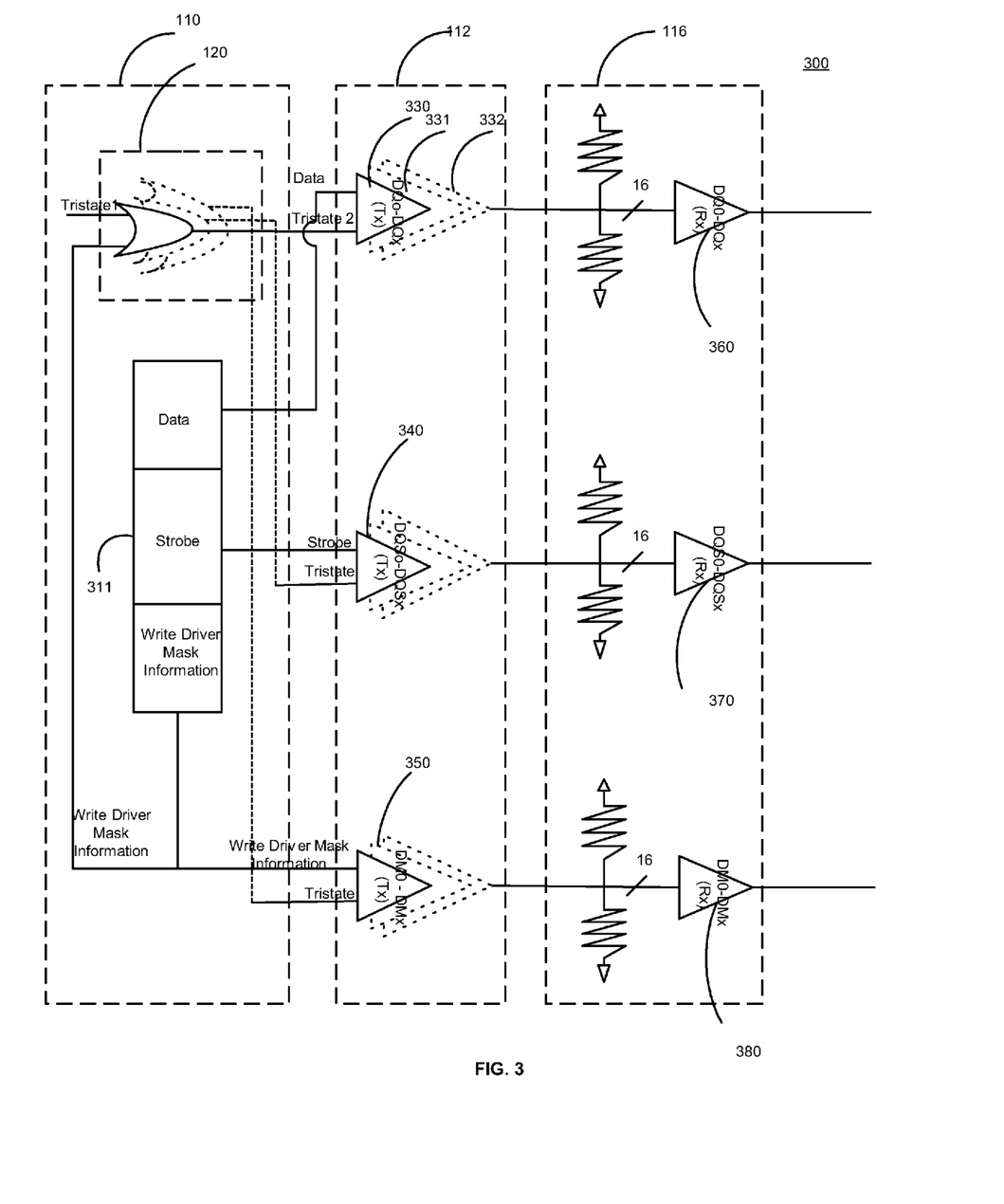
FIG. 3 illustrates a circuit level description used in implementing a memory interfacing circuit system.

FIG. 3 illustrates an embodiment of a circuit level description for implementing a memory interfacing circuit system that can be utilized to achieve significant power reduction during DDR memory transactions. In this embodiment, the system 300 comprises a memory controller 110 that includes logic gates 120 having inputs that receive write driver mask information, and tristate data (i.e., tristate1) generated from a register block 311 associated with the memory controller 110. The register block 311 holds data, strobe, and write driver mask information. The data, strobe and write driver mask information can be generated by the memory controller 110. The memory controller 110 may accept requests from different components associated memory client 106 (FIG. 1). The memory controller 110 then determines which component may read/write to memory and when such reading/writing can occur. The memory controller 110 also determines whether a read, write, no operation, or self refresh, is to be performed. The logic gates 120 receive tristate input (i.e., tristate1), which can be generated by tristate logic (not shown) associated with the memory controller 110. Such tristate logic is related to writing and reading. The logic gates 120 then generates tristate signals such as tristate2 that serve as input to the data bus drivers 330. The tristate signals outputted from the logic gates 120 may enable the data bus drivers 330 during a write operation, and disable or tristate such data bus drivers 330 at any other time. In some cases, the data bus drivers 330 can be used for reads to terminate by having the data bus drivers 330 on during reads as well. The tristate logic can be configured within in the data bus drivers 330 or in the memory controller. The logic gates 120 are adapted to be operatively responsive to the write driver mask information. The logic gates 120 may be configured as an OR-gate structure comprised of a plurality of OR gates each one having the write driver mask information as input. Each OR-gate may have its output coupled to an input of a respective data bus driver 330. Thus, a combination of write driver mask information and tristate data (i.e., tristate1) causes each OR-gate structure to generate an output that serves as input (i.e., tristate2) to a respective data bus driver 330. Each of the data bus driver 330 input signals (i.e., tristate2) generated from the logic gates 120 (i.e., the OR-gate structure) can then be operative to disable selected ones of the plurality of data bus drivers 330 during a write operation. Each of the data bus drivers 330 are provided with write driver mask information as well as tristate information in order to disable respective data bus drivers 330 when such data bus drivers 330 are not writing to memory. This provides a scheme that enables the controller 310 to select which data bus drivers 330 to disable during a write operation in contrast to turning on each data bus driver 330 during a write operation. Moreover, having write driver mask information in conjunction with the tristate1 data helps ensure that each selected data bus driver 330 is, indeed, not drawing power when such data bus driver 330 is disabled. This helps reduce the power consumption of the overall system 300. Of course, the logic gates 120 can be configured to enable any of the data bus drivers 330 during a write operation in order to achieve write driver mask information that facilitates power reduction. Moreover, other configurations of logic gates may be configured to include any combination of NAND, XOR, XNOR gates or any other equivalent combinatorial logic so as to accomplish the desired goal of disabling or enabling data bus drivers during a write operation using write driver mask information to achieve power reduction.

A plurality of the data bus drivers 330, strobe drivers 340, and data mask drivers 350 may be included in the DDR I/O transceiver block 112. In another embodiment, the DDR I/O transceiver block 312 may be configured with the logic gates 120, as described in FIG. 2. In operation, at least one of the data mask drivers 350 can be selected to receive the write driver mask information and generate outputs. Further, the input of at least one data mask driver 350 is operatively coupled to the inputs of logic gates 120. This write driver mask information operates on the logic gates 120 to help select which of any of the plurality of data bus drivers 330 to mask. Outputs from the data mask drivers 350 are provided to indicate the presence or absence of write driver mask information when data is outputted by memory. Such data mask outputs are sent to the DDR memory 114, to inform it to ignore (DM=1) or write (DM=0) to the memory. Also, at least one strobe driver 340 is configured to generate strobe signals at predetermined clock intervals of the write operation. The strobe signal is used as a clock to latch in data on the rising and falling edge. Due to the high-speed data transfers that are associated with DDR DRAMs, each strobe driver 340 may be configured to register data that is being inputted or outputted on both edges of the clock. Each strobe driver 340 receives a strobe signal input and a tristate input which can both be generated by the controller 110. The outputs from the strobe drivers then serve as inputs to the DDR I/O receive block 316.

The DDR I/O transceiver block 116 may be comprised of a plurality of DDR receivers 360 that are operatively coupled to each of the plurality of data bus drivers 330. Outputs from the data strobe drivers 340 are operatively coupled to inputs of a plurality of strobe receivers 370. Strobe receivers 370 are provided to facilitate the operations of the DDR memory transactions during high speed data transfers by accurately receiving the data strobe associated with the strobe driver 340. Outputs from data mask drivers 350 are operatively coupled to inputs of the data mask receivers 380. Data mask receivers 380 are configured to receive the data write driver mask information that are outputted by the data mask drivers 350, which indicate the presence or absence of write driver mask information when data is outputted by memory. Each of the plurality of DDR receivers 360, strobe receivers 370 and data mask receivers 380 have inputs configured with at least one pull-up resistor and at least one pull-down resistor to cause a mid-point termination structure. Such mid-point termination structures help improve the signal integrity of the bus lines during operations by eliminating reflections of electrical waves at a destination that may otherwise cause interference. Although the bus lines associated with each of the drivers and receivers indicate 16-bits bus widths, larger bus sizes such as 32-bit and 64-bit bus widths are also contemplated.

Figure 4:
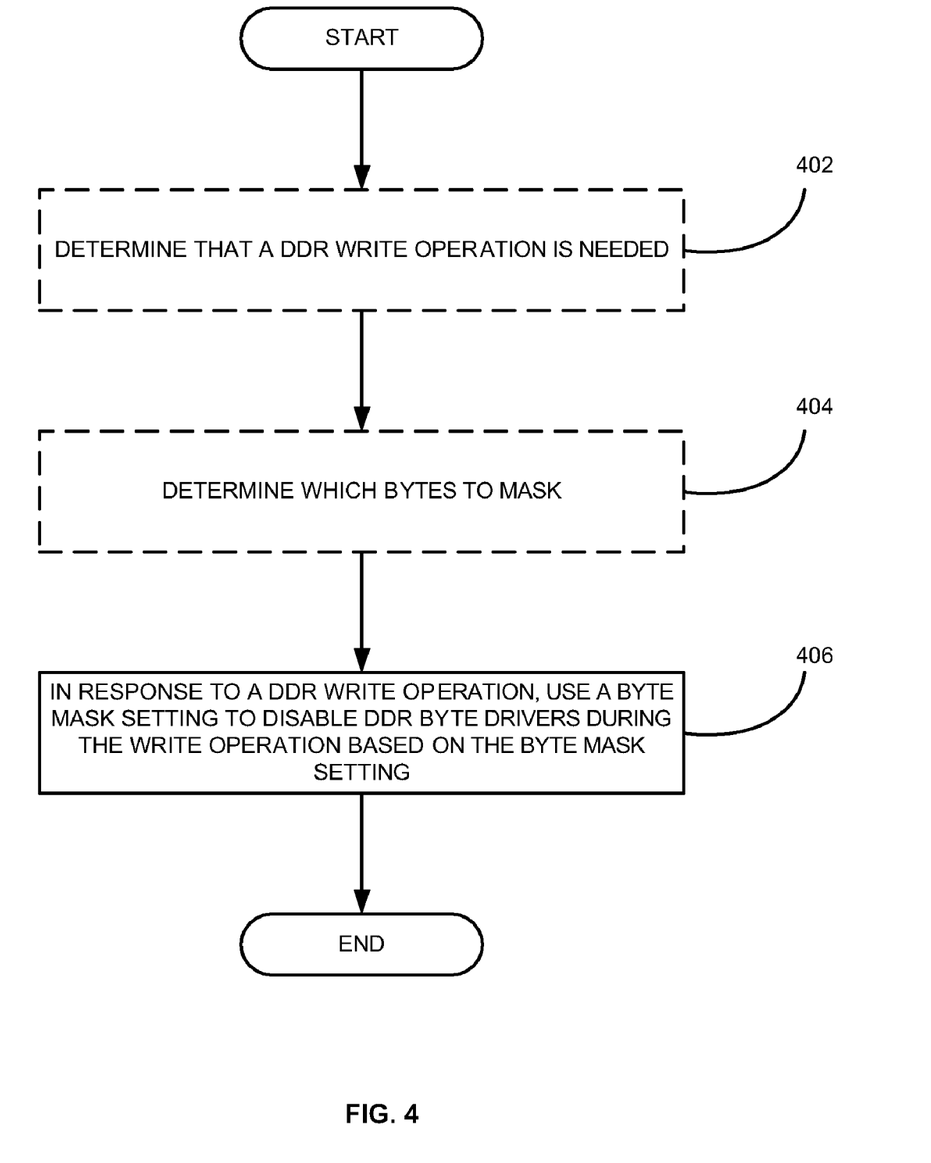
FIG. 4 illustrates in flowchart form a method of controlling data bytes in memory.

Referring now to FIG. 4, a method of controlling data bytes in memory based on a DDR write operation is described. In one embodiment, if desired, a DDR memory controller (110, 210) can be configured to determine when a DDR write operation is needed, in operation 402. Also, if desired, the DDR memory controller (110, 210) may be configured determine which bytes to mask, in operation 404. In operation 406, based on a byte mask setting, the DDR memory controller 110 may disable a plurality of DDR data bus drivers in response to write driver mask information (i.e., byte mask setting) during the write operation. As described earlier, logic gates can also be configured via the combinatorial gate logic to operate on the write driver mask information to determine which of the plurality of DDR data bus drivers to disable and/or enable. As an example, consider the circuit configuration as described in FIG. 3. The memory controller 110 may receive a request, from at least one component associated with the memory client 106 (FIG. 1), to write to memory. Such a request can cause the memory controller 110 to determine that a write operation is needed. In this example, the memory controller 110 may determine that such write operation requires an operation on data bus drivers 330, 331 and 332. Such an operation on data bus drivers 330, 331 and 332 may entail turning on data bus drivers 330 and 331, and shutting off data bus drivers 332 during the write operation. In such a case, the memory controller 110 can determine to send a byte mask setting of "110". Thus, the logic gates 120 within the memory controller 110 can operate on the data bus drivers 330, 331, 332 in response to the byte mask setting of "110". Thus, based on the byte mask setting of "110", data bus drivers 330 and 331 are turned on while data bus driver 332 is selectively disabled during the write operation. Such disabling of selected data bus drivers during write operations leads the system 300 to reduce its power consumption.

Figure 5:
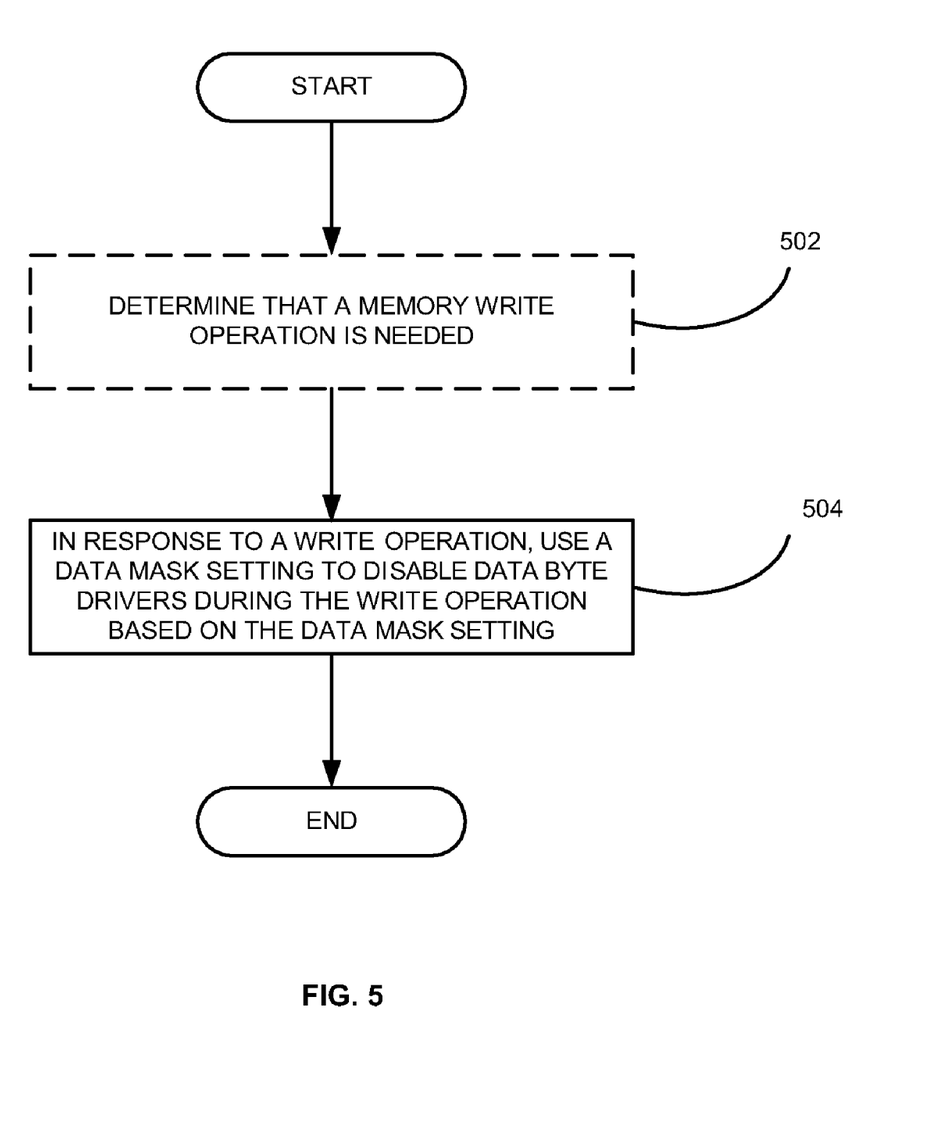
FIG. 5 illustrates in flow-chart form another method for controlling data bytes in memory.

FIG. 5 illustrates in flow-chart form another method for controlling data bytes in memory. In one embodiment, if desired, a memory controller can be configured to determine when a write operation is needed, in operation 502. In operation 504, based on a byte mask setting, the memory controller may disable a plurality of data bus drivers in response to write driver mask information (i.e., byte mask setting) during the write operation. The write driver mask information may be sent over a bus to disable the data bus drivers, and thus, lead the system to reduce its power consumption. As an example, consider again the circuit configuration as described in FIG. 3. The memory controller 110 may receive a request, from at least one component associated with the memory client 106 (FIG. 1), to write to memory. Such a request can cause the memory controller 110 to determine that a write operation is needed. In such a case, the memory controller 110 can determine to send a byte mask setting of "110", which entails turning on data bus drivers 330 and 331, and shutting off data bus drivers 332 during the write operation. Thus, in response to the byte mask setting of "110", data bus drivers 330 and 331 are turned on while data bus driver 332 is selectively disabled during the write operation. Such disabling of selected data bus drivers during write operations leads the system 300 to reduce its power consumption.

Figure 6:
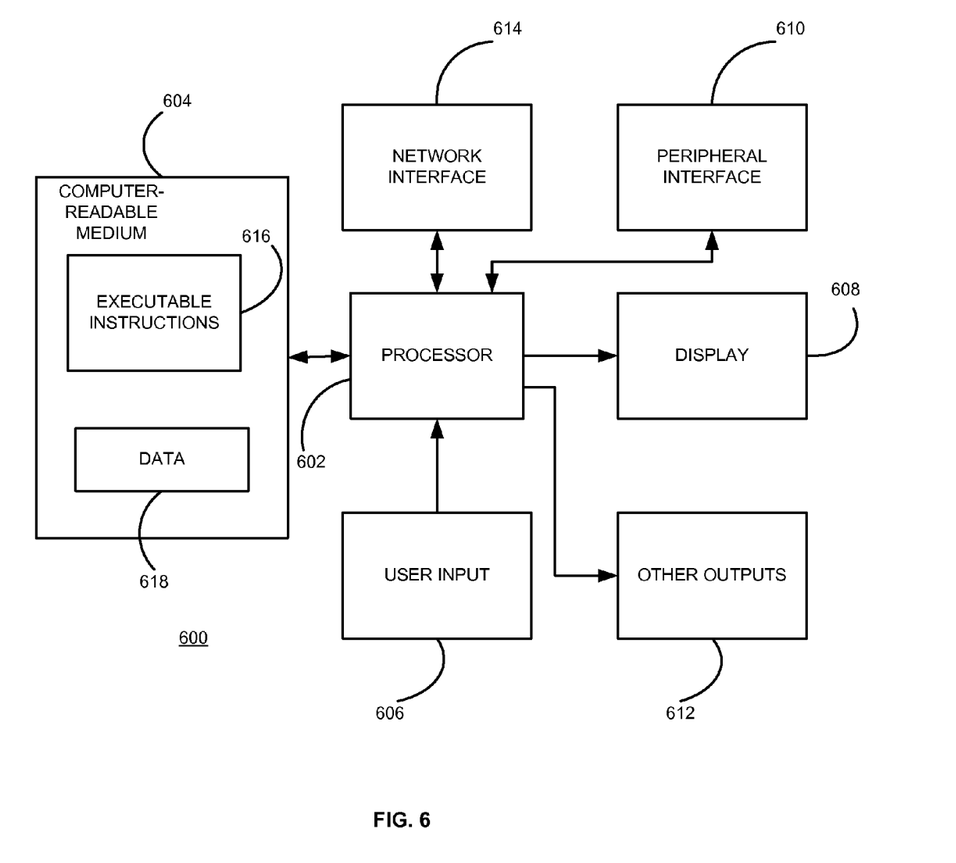
FIG. 6 illustrates a block of an exemplary processing device that may be used to implement the techniques described herein.

Referring now to FIG. 6, an exemplary device 600 that may be used to implement the present invention is further illustrated. With reference once again to FIGS. 1-3, the device 600 or similar devices may be used to implement, for example, the one or more systems 100, 200 that, in turn, may be used to implement, for example, the memory interface circuit 300. Regardless, the device 600 comprises a processor 602 (e.g., memory client 106, 206) coupled to a computer-readable medium 604. The computer-readable medium 604, in turn, comprises stored executable instructions 616 and data 618. In an embodiment, the processor 602 may comprise one or more processing devices such as a microprocessor, microcontroller, digital signal processor, or combinations thereof capable of executing the stored instructions 616 and operating upon the stored data 618. Likewise, the computer-readable medium 604 may comprise one or more devices such as CDROM, RAM, other forms of ROM, hard drives, distributed memory etc. Processor and storage arrangements of the types illustrated in FIG. 6 are well known to those having ordinary skill in the art. In this embodiment, the processing techniques described herein in systems 100, 200 are implemented as a combination of executable instructions and data within the computer-readable medium 604.

In a one embodiment, the device 600 may comprise one or more user input devices 606, a display 608, a peripheral interface 610, other output devices 612 and a network interface 614 all in communication with the processor 602. The user input device 606 may comprise any mechanism for providing user input to the processor 602. For example, the user input device 606 may comprise a keyboard, a mouse, a touch screen, microphone and suitable voice recognition application or any other means whereby a user of the device 600 may provide input data to the processor 602. The display 608, may comprise any conventional display mechanism such as a cathode ray tube (CRT), flat panel display, or any other display mechanism known to those having ordinary skill in the art. The peripheral interface 610 may include the necessary hardware, firmware and/or software necessary to communication with various peripheral devices, such as media drives (e.g., magnetic disk or optical disk drives) or any other source of input used in connection with the instant techniques. Likewise, the other output devices 612 may optionally comprise similar media drive mechanisms as well as other devices capable of providing information to a user of the device 600, such as speakers, LEDs, tactile outputs, etc. Finally, the network interface 614 may comprise hardware, firmware and/or software that allows the processor 602 to communicate with other devices via wired or wireless networks, as known in the art.

While the device 600 has been described as an embodiment for implementing the techniques described herein, those having ordinary skill in the art will appreciate that other, functionally equivalent techniques may be equally employed. For example, as known in the art, some or all of the executable instruction-implemented functionality may be implemented using firmware and/or hardware devices such as application specific integrated circuits (ASICs), programmable logic arrays, state machines, etc. Further still, other implementation of the device 600 may include a greater or lesser number of components than those illustrated. For example, when used to implement the system 100, 200, the device 600 may not include the display 608 or user inputs 606. Once again, those of ordinary skill in the art will appreciate the wide number of variations that may be used is this manner.

As noted above, among other advantages, a memory interface circuit, method and system is provided that consumes less power than known memory interface circuits and systems employing double data rate (DDR) memories. The memory interface circuit reduces the amount of power consumption that occurs during DDR write operations by determining which bytes actually need to transmit and which bytes do not. Accordingly, by using write driver mask information with tristate data/circuit to turn off (i.e., tri-state) selected I/O drivers associated with a DDR I/O transceiver, the memory interface circuit consumes less power than known memory interface circuits, methods and systems. Other advantages will be recognized by those of ordinary skill in the art.

Also, integrated circuit design systems (e.g., work stations) are known that create integrated circuits based on executable information stored on a computer readable memory such as but not limited to CDROM, RAM, other forms of ROM, hard drives, distributed memory etc. The information may include data representing (e.g., compiled or otherwise represented) any suitable language such as, but not limited to, hardware descriptor language or other suitable language. As such, the circuits and/or modules described herein may also be produced as integrated circuits by such systems. For example, an integrated circuit may be created using information stored on a computer readable medium that when executed cause the integrated circuit design system to create a memory interface circuit that includes a plurality of data bus drivers and logic adapted to be operatively responsive to write driver mask information. The plurality of bus drivers are adapted to be responsive to a write operation. The logic is also adapted to disable any one of the plurality of data bus drivers based on the write driver mask information during the write operation. Integrated circuits having a circuit and/or module that performs other operations described herein may also be suitably produced.

While this disclosure includes particular examples, it is to be understood that the disclosure is not so limited. Numerous modifications, changes, variations, substitutions, and equivalents will occur to those skilled in the art without departing from the spirit and scope of the present disclosure upon a study of the drawings, the specification, and the following claims.

What is claimed is:

1. A memory interface circuit, comprising:
    logic adapted to be operatively responsive to write driver mask information and to disable any of a plurality of data bus drivers based on the write driver mask information during a write operation, the logic including a structure that comprises a plurality of gates, wherein each gate includes an input responsive to the write driver mask information and an output coupled to a respective bus driver.

2. The memory interface circuit in claim 1, wherein the plurality of data bus drivers are adapted to be responsive to a write operation.

3. The memory interface circuit in claim 1, further comprising:
    at least one strobe driver configured to generate strobe signals at predetermined clock intervals of the write operation; and
    at least one data mask driver configured to receive the write driver mask information and generate outputs that determine which data bytes to mask, wherein the at least one data mask driver is operatively coupled to the logic, the logic being capable of selecting any one of at least one of the plurality of data bus drivers.

4. An apparatus, comprising the memory interface circuit of claim 1.

5. The memory interface circuit in claim 1, wherein the plurality of gates comprises a plurality of OR gates.

6. A method of controlling data bytes in memory, comprising:
    responsive to a double data rate (DDR) write operation, disabling at least one corresponding DDR bus driver of a plurality of DDR bus drivers during the write operation based on a predetermined byte mask setting using a structure in order to reduce power consumption, the structure including a plurality of gates, wherein each gate includes an input responsive to the predetermined byte mask setting and an output coupled to a respective DDR bus driver.

7. A method of controlling data bytes in memory, comprising:
    responsive to a write operation, disabling a plurality of data bus drivers in response to write driver mask information during the write operation using a structure including a plurality of gates, wherein each gate includes an input responsive to the write driver mask information and an output coupled to a respective data bus driver; and
    sending the write driver mask information over a bus while disabling the data bus drivers in order to reduce power consumption.

8. The method of claim 7, further comprising:
    generating strobe signals at predetermined clock intervals of the write operation; and
    determining data bytes to mask when the write operation is required.

9. A system for memory interfacing, comprising:
    a double data rate (DDR) interface, comprising:
        a plurality of data bus drivers adapted to be responsive to a write operation, and
        logic adapted to be operatively responsive to write driver mask information, the logic being operative to disable selected ones of the plurality of data bus drivers based on the write driver mask information during the write operation; and
    DDR memory, comprising:
        a plurality of DDR receivers operatively coupled to the data bus drivers, each of the plurality of DDR receivers having inputs configured with at least one pull-up resistor and at least one pull-down resistor to cause a mid-point termination structure.

10. The system in claim 9, further comprising:
    at least one strobe driver configured to generate strobe signals at predetermined clock intervals of the write operation; and
    at least one data mask driver configured to receive the write driver mask information and generate outputs that determine which data bytes to mask, wherein the at least one data mask driver is operatively coupled to the logic, the logic being capable of selecting any one of at least one of the plurality of data bus drivers.

11. The system in claim 9, wherein the DDR memory controller is operative to determine whether the write operation is required.

12. The system in claim 9, wherein the mid-point termination structure causes a corresponding one of each of the DDR receivers to be pulled high in the absence of a write operation, and/or the mid-point termination structure causes a corresponding one of each of the DDR receivers to be pulled low during a write operation.

13. The system in claim 9, wherein the logic includes an OR-gate structure that comprises a plurality of OR gates each one having an input responsive to write driver mask information and output coupled to a respective bus driver.

14. An apparatus for controlling data bytes in memory, comprising:
    a processor; and
    a computer-readable medium having stored thereon executable instructions that, when executed by the processor, cause the processor to:
        determine a write operation is needed;
        disable a plurality of data bus drivers in response to write driver mask information during the write operation using a structure including a plurality of gates, wherein each gate includes an input responsive to the write driver mask information and an output coupled to a respective data bus driver; and send the write driver mask information over a bus while disabling the data bus drivers in order to reduce power consumption.

15. The apparatus of claim 14, wherein the processor-readable medium further comprises executable instructions that, when executed by the processor, cause the processor to:

generate strobe signals at predetermined clock intervals of the write operation; and determine data bytes to mask when the write operation is required.

16. An apparatus for controlling data bytes in memory, comprising:

a processor; and a computer-readable medium having stored thereon executable instructions that, when executed by the processor, cause the processor to:

determine whether a double data rate (DDR) write operation is needed; and disable a corresponding DDR bus driver during the write operation based on a predetermined byte mask setting using a structure in order to reduce power consumption, the structure including a plurality of gates, wherein each gate includes an input responsive to the predetermined byte mask setting and an output coupled to a respective DDR bus driver.

17. A computer-readable medium having stored thereon executable instructions that, when executed by a processor, cause the processor to:

disable, responsive to a double data rate (DDR) write operation, at least one corresponding DDR bus driver of a plurality of DDR bus drivers during the write operation based on a predetermined byte mask setting using a structure in order to reduce power consumption, the structure including a plurality of gates, wherein each gate includes an input responsive to the predetermined byte mask setting and an output coupled to a respective DDR bus driver.

18. The computer-readable medium of claim 17, wherein the instructions are configured as a hardware description language.

* * * * *